United States Patent [19]

Durnwirth, Jr. et al.

[11] Patent Number: 4,978,423
[45] Date of Patent: Dec. 18, 1990

[54] SELECTIVE SOLDER FORMATION ON PRINTED CIRCUIT BOARDS

[75] Inventors: Roy K. Durnwirth, Jr., Midlothian; John E. George; Kim L. Morton, both of Richmond, all of Va.

[73] Assignee: AT&T Bell Laboratories, Murray Hill, N.J.

[21] Appl. No.: 249,133

[22] Filed: Sep. 26, 1988

[51] Int. Cl.$^5$ .............................................. H05K 3/06
[52] U.S. Cl. .................................. 156/659.1; 156/664; 156/901
[58] Field of Search ..................... 156/659.1, 664, 654, 156/656, 901

[56] References Cited

U.S. PATENT DOCUMENTS

| | | | |
|---|---|---|---|
| 3,240,684 | 3/1966 | Martin et al. | 156/659.1 |
| 3,576,630 | 4/1971 | Yanagawa | 156/659.1 |
| 4,004,956 | 1/1977 | Brindisi, Jr. | |
| 4,216,246 | 8/1980 | Iwasaki et al. | 156/668 |
| 4,306,933 | 12/1981 | DaFonte, Jr. | |
| 4,319,955 | 3/1982 | Murski | 156/659.1 |
| 4,487,828 | 12/1984 | Hladovcak et al. | 156/659.1 |

FOREIGN PATENT DOCUMENTS 2087157 5/1982 United Kingdom .

OTHER PUBLICATIONS

Hackh's Chemical Dictionary, 4th Ed., McGraw-Hill, New York, 1969, pp. 622–623.

*Primary Examiner*—David Simmons
*Assistant Examiner*—Lori-Ann Johnson
*Attorney, Agent, or Firm*—Lester B. Birnbaum

[57] ABSTRACT

Disclosed is a method of providing solder on selected portions of a printed circuit board. Solder is first electroplated over copper conductor patterns on the board by means of a first photoresist layer. After stripping the first photoresist, a second photoresist layer is laminated over the board and developed to expose selected portions of the solder. The exposed portions are selectively stripped. The copper exposed by the selective stripping is then subjected to a scrubbing while the photoresist protects the remaining solder, and the second photoresist is removed.

8 Claims, 4 Drawing Sheets

SELECTIVE SOLDER FORMATION ON PRINTED CIRCUIT BOARDS

BACKGROUND OF THE INVENTION

This invention relates to the fabrication of printed circuit boards.

In a typical circuit board processing sequence, copper conductors are formed over the board by electroless deposition of a thin copper layer followed by selective electroplanting of a thick copper layer in the desired conductive pattern utilizing a photoresist. A solder layer is usually applied uniformly over the electroplated copper to act as an etch resist. After removal of the portions of the electroless copper layer and any underlying layer not covered by the electroplated layer, a dry film solder mask is applied over the structure and the board is ready for mounting of semiconductor components. If it is desired to have solder in selected areas, the solder is deposited by screen printing.

In cases where solder is desired on selected portions of the copper conductor, present screen printing techniques are usually adequate. However, certain applications require very dense conductor arrays (i.e., typically less than 625 $\mu$m pitch). For such spacing, a more accurate method of providing solder selectively on the conductors is desired.

SUMMARY OF THE INVENTION

The invention is a method for fabricating printed circuit boards. A pattern of conductive material is formed over an insulating substrate, and a layer of solder is deposited over the conductive pattern. A photoresist mask is formed over the resulting structure so as to expose areas of solder to be removed, and these exposed areas are then selectively removed. If desired, the conductive material exposed by the solder removal can be scrubbed while the photoresist acts to protect the remaining portions of the solder.

BRIEF DESCRIPTION OF THR DRAWING

These and other features of the invention are delineated in detail in the following description. In the drawing:

FIG. 1 is a plan view of a portion of a printed circuit board fabricated in accordance with an embodiment of the invention; and FIGS. 2-10 are cross-sectional views of a portion of the printed circuit board during various stages of fabrication in accordance with the same embodiment.

It will be appreciated that for purposes of illustration these figures are not necessarily drawn to scale.

DETAILED DESCRIPTION

Figure 1:
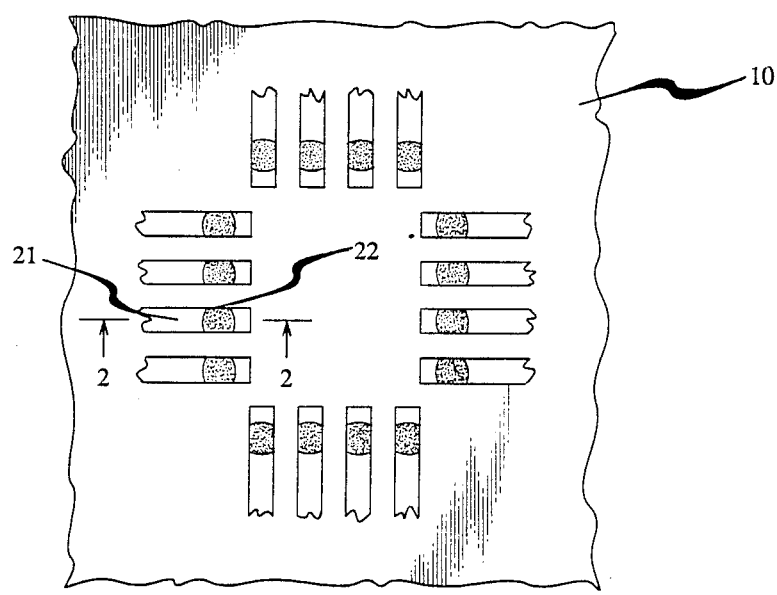

FIG. 1 illustrates a portion of a printed circuit board suitable for bonding a semiconductor component (not shown). It will be appreciated that this portion is shown for illustrative purposes only, and the board would include many more conductor paths and components. The board, 10, includes a set of conductors, e.g., 21, which are formed in close proximity to each other. In this example, the center-to-center spacing (pitch) is 400 $\mu$m and the invention is most useful when the pitch is less than 625 $\mu$m. The conductors will be electrically connected to the semiconductor component mounted to the board by means of stantard procedures such as tape automated bonding (TAB). In order to effectuate this interconnection, bonding areas, 22, are formed near the edge of the conductors in order to bond the tape members from the semiconductor component to the conductors. The bonding areas, 22, include a layer of solder formed on the conductors as described in more detail below.

Figure 2:
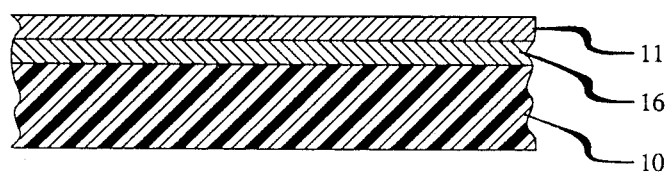

In order to illustrate the method of the invention, FIGS. 2-10 are cross-sectional views along line 2—2' of FIG. 1 showing a conductor during various stages of fabrication. As illustrated in FIG. 2, the board, 10, is first entirely covered by a thin layer, 16, of copper formed by electroplating and a thin layer of copper, 11, formed by a standard electroless deposition. In this particular example, the copper layer, 16, is approximately 18 $\mu$m thick and the upper layer, 11, is approximately 2.5 $\mu$m thick.

Figure 3:
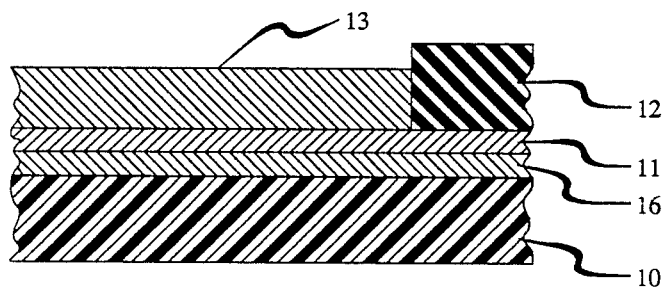

Next, as illustrated in FIG. 3, a first photoresist layer, 12, was formed over essentially the entire surface of the copper layers and then developed by standard photolithographic techniques to expose an appropriate pattern. The photoresist is typically an aqueous resist such as Dynachem HG which is laminated onto the layer, 11, to a thickness of approximately 50 $\mu$m. The structure was then subjected to a copper electroplating so that copper layers, such as 13, were formed on the exposed areas of the electroless copper layer 11. This copper layer, which defines the conductor pattern in the final circuit board, was approximately 25-35 $\mu$m thick and could, generally, be in the range 25-50 $\mu$m. Standard electroplating techniques were utilized.

Figure 4:
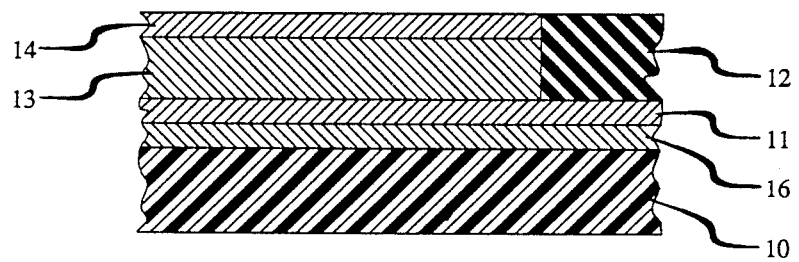
Figure 5:
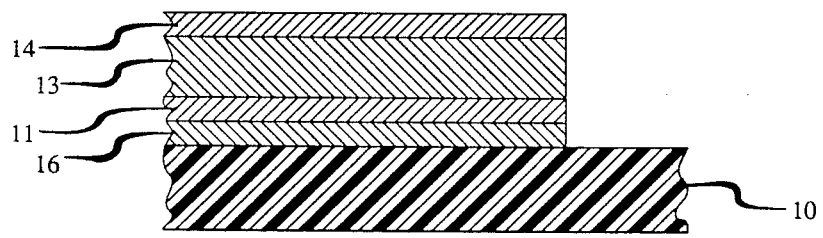

In the next step, as illustrated in FIG. 4, a layer 14, of solder was electroplated onto the copper layer 13. The thickness and composition of this solder layer will depend on the particular type of bonding employed for the semiconductor component. For the case of TAB bonding, it has been found that a thickness of at least approximately 7.5 $\mu$m is desirable to achieve an appropriate final, reflowed thickness of the solder layers. The particular solder employed was tin-lead solder, with the tin component between 55 and 80% by weight, the remainder lead. The photoresist layer, 12, was then stripped off using a solution which does not attack solder, such as an ethanol amine solution, in particular that sold by Inland Chemical Corporation under the designation 6055. Next, the portions of the electroless copper layer, 11, and the copper layer, 16, not covered by the electroplated copper, 13, and solder layer, 14, were etched to define the conductor pattern for the circuit board. This results in the structure of FIG. 5 A typical etchant is a near neutral PH alkaline etchant such as ultra Etch-Fine line from MacDermid Corporation.

Figure 6:
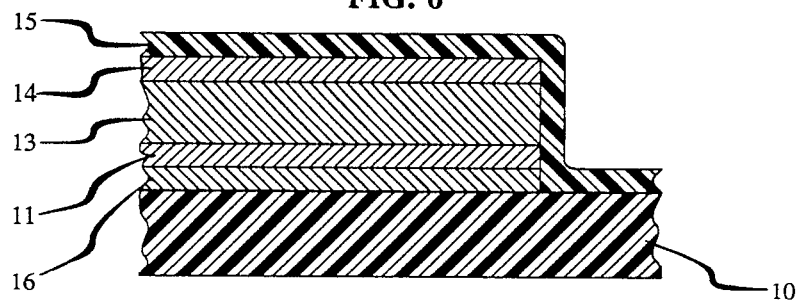

As illustrated in FIG. 6, a second photoresist layer, 15, was then formed over the board and conductor pattern including the plated solder layer 14. Prior to deposition the board was UV heated to a temperature so that the surface of the board was in the range 38°-48° C. Conformance the photoresist to the features on the board and good adhesion to the solder layer as well as to the board surface are extremely important for ensuring a well-defined solder stripping in the following steps. Preferably, the photoresist layer is deposited by vacuum lamination to a thickness in the range 75-100 $\mu$m to satisfy these requirements. In this example, the resist was Dynachem TA. The temperature during the lamination was in the range 90°-100° C. and the pressure was 0.5-0.8 millibars for a time of 60-70 sec.

Figure 7:
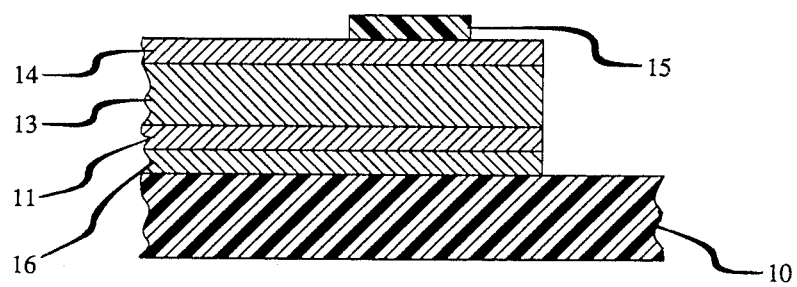

Next, as illustrated in FIG. 7, the photoresist layer, 15, was developed so as to expose underlying portions of the plated solder layer 14. Standard photolithography was used. However, care must be taken to ensure that no photoresist residue is left on the exposed solder portions to interfere with the solder stripping.

Figure 8:
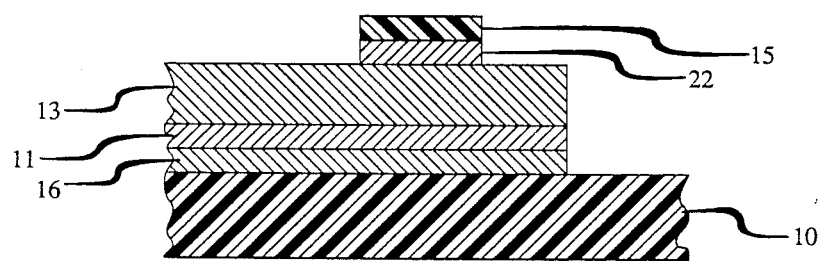

After photoresist layer, 15, was fully developed, as shown in FIG. 8, the exposed portions of solder layer, 14, were selectively removed leaving the solder portions, 22, protected by the photoresist on the copper layer 13. The solder was selectively etched utilizing an etchant comprising hydrogen peroxide such as Enthone TL-143 which was applied by spray for a period of approximately 10 sec.

It was found that the photoresist, 15, adhered well to the protected solder portions, 22, as well as to the surface of the circuit board, 10, during the chemical stripping so that the solder portions were well defined. In this particular example, the portions measured approximately $225 \times 2500$ μm.

In the next step, the exposed portions of the copper layer, 13, were subject to a pumice scrubbing in order to micro-roughen the copper surface in preparation for solder mask adhesion. This, basically involves applying a silica mixture with nylon brushes to the entire structure in order to clean the copper surfaces. The specific gravity of the pumice mixture was 1.075–1.125, gms/cm$^3$. Cleaning usually is done for a period of approximately 5 sec. The photoresist layer, 15, protects the remaining solder portions, 22, from the abrasive action of the silica and brushes. Thus, it is important that the photoresist layer can withstand the scrubbing and maintain adherence to the solder layer during this cleaning operation.

Figure 9:
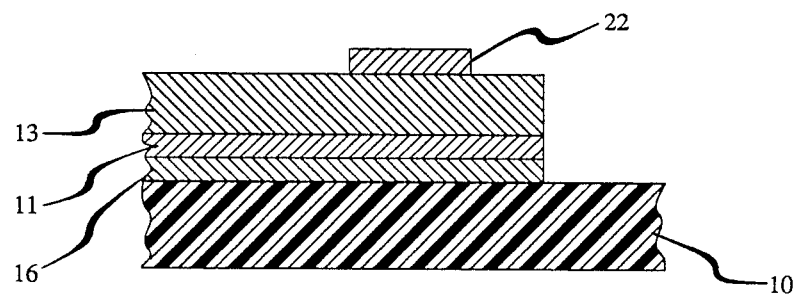

Subsequent to the cleaning operation, the photoresist was stripped off to leave the structure shown in FIG. 9. Of course, the resist must be stripped without significantly reducing the remaining solder portions 22. In addition, it is desirable to avoid the oxidation of the exposed copper layer, 13, to avoid adhesion problems when a dry film solder mask is applied later. The particular stripping solution employed was an ethanol-amine solution including an inhibitor, anti-oxidant and chelator such as that sold by Inland Chemical under the designation 6055. It will be appreciated that other photoresists and stripping solutions may be employed in the inventive process.

Figure 10:
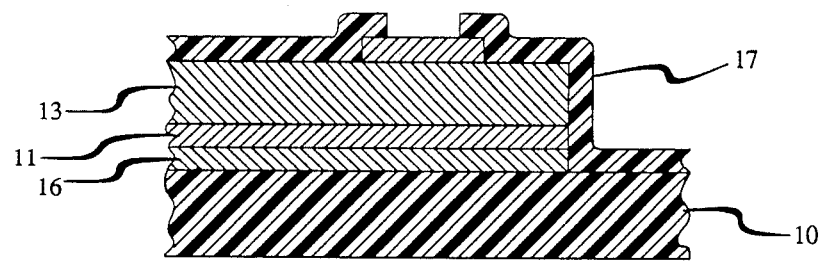

In subsequent processing, a standard commercially available dry film solder mask 17, is usually vacuum laminated over the structure to a thickness of approximately 75 μm as shown in FIG. 10. The portions of the mask over the solder portions were then removed by a standard aqueous developer such as sodium carbonate. After a suitable bake and UV cure, the solder portions 22, were reflowed by exposing the structure to an infrared source which sufficiently heats the solder to cause it to melt and cover the side walls of the copper layers 13, 11 and 16. The purpose of the solder mask is to keep the solder off the protected areas of the copper during subsequent assembly of the circuit. The board is then ready for mounting of semiconductor components thereon.

It will be appreciated that materials other than those specified in the example above can be utilized in the inventive process. For example, the invention can be used to selectively form solder on any type of conductor.

Various additional modifications will become apparent to those skilled in the art. All such variations which basically rely on the teaching through which the invention has advanced the art are properly considered within the scope of the invention.

We claim:

1. A method of fabricating printed circuit boards comprising the steps of:
   forming a pattern of conductive material over an insulating substrate;
   depositing a layer of solder over the pattern of conductive material;
   depositing a photoresist mask layer by vacuum lamination over the resulting structure and developing the layer so as to expose areas of solder to be removed;
   selectively removing the exposed areas of solder to expose portions of the conductive material; and
   pumice scrubbing the portions of conductive material exposed by the selective removal of the solder while the photoresist mask protects the remaining solder.

2. The method according to claim 1 wherein the conductive material comprises electroplated copper.

3. The method according to claim 2 wherein the thickness of the copper is within the range 25–50 μm.

4. The method according to claim 1 wherein the solder comprises tin and lead.

5. The method according to claim 1 wherein the solder thickness is at least 7.5 μm.

6. The method according to claim 1 wherein the thickness of the photoresist is within the range 75–100 μm.

7. The method according to claim 1 wherein the solder is removed by applying a solution comprising hydrogen peroxide.

8. The method according to claim 1 wherein the conductive material pattern includes strips which have a pitch less than 625 μm.

* * * * *